United States Patent
Maccalli et al.

(10) Patent No.: US 7,615,121 B2
(45) Date of Patent: *Nov. 10, 2009

(54) SUSCEPTOR SYSTEM

(75) Inventors: Giacomo Nicolao Maccalli, Milan (IT); Gianluca Valente, Milan (IT); Olle Kordina, Oldsmar, FL (US); Franco Preti, Milan (IT); Danilo Crippa, Novara (IT)

(73) Assignee: E.T.C. Epitaxial Technology Center SRL, Catania (IT)

( * ) Notice: Subject to any disclaimer, the term of this patent is extended or adjusted under 35 U.S.C. 154(b) by 138 days.

This patent is subject to a terminal disclaimer.

(21) Appl. No.: 10/538,529

(22) PCT Filed: Dec. 10, 2002

(86) PCT No.: PCT/IT02/00774

§ 371 (c)(1), (2), (4) Date: Jun. 10, 2005

(87) PCT Pub. No.: WO2004/053188

PCT Pub. Date: Jun. 24, 2004

(65) Prior Publication Data

US 2006/0118048 A1    Jun. 8, 2006

(51) Int. Cl.
*C23C 16/46* (2006.01)
*H01L 21/00* (2006.01)

(52) U.S. Cl. .................. 118/728; 118/725

(58) Field of Classification Search ........... 118/728, 118/725

See application file for complete search history.

(56) References Cited

U.S. PATENT DOCUMENTS 3,980,854 A    9/1976 Berkman et al.

(Continued)

FOREIGN PATENT DOCUMENTS

FR    2 650 841    2/1991

(Continued)

OTHER PUBLICATIONS

Zhang, J., et al., "Growth Characteristics of SiC in a Hot-Wall CVD Reactor with Rotation", Journal of Crystal Growth 241 (2002) pp. 431-438.

(Continued)

*Primary Examiner*—Sylvia R. MacArthur
(74) *Attorney, Agent, or Firm*—Fredrikson & Byron, P.A.

(57) ABSTRACT

The present invention relates to a susceptor system for an apparatus of the type adapted to treat substrates and/or wafers; the susceptor system is provided with a cavity (1) which acts as a chamber for the treatment of the substrates and/or wafers and which extends in a longitudinal direction and is delimited by an upper wall (2), by a lower wall (3), by a right-hand side wall (4), and by a left-hand side wall (5); the upper wall (2) is constituted by at least one piece of electrically conducting material suitable for being heated by electromagnetic induction; the lower wall (3) is constituted by at least one piece of electrically conducting material suitable for being heated by electromagnetic induction; the right-hand side wall (4) is constituted by at least one piece of inert, refractory and electrically insulating material; the left-hand side wall (5) is constituted by at least one piece of inert, refractory and electrically insulating material; the piece of the upper wall (2) is thus electrically well insulated from the piece of the lower wall (3).

27 Claims, 5 Drawing Sheets

U.S. PATENT DOCUMENTS

Figure 1:
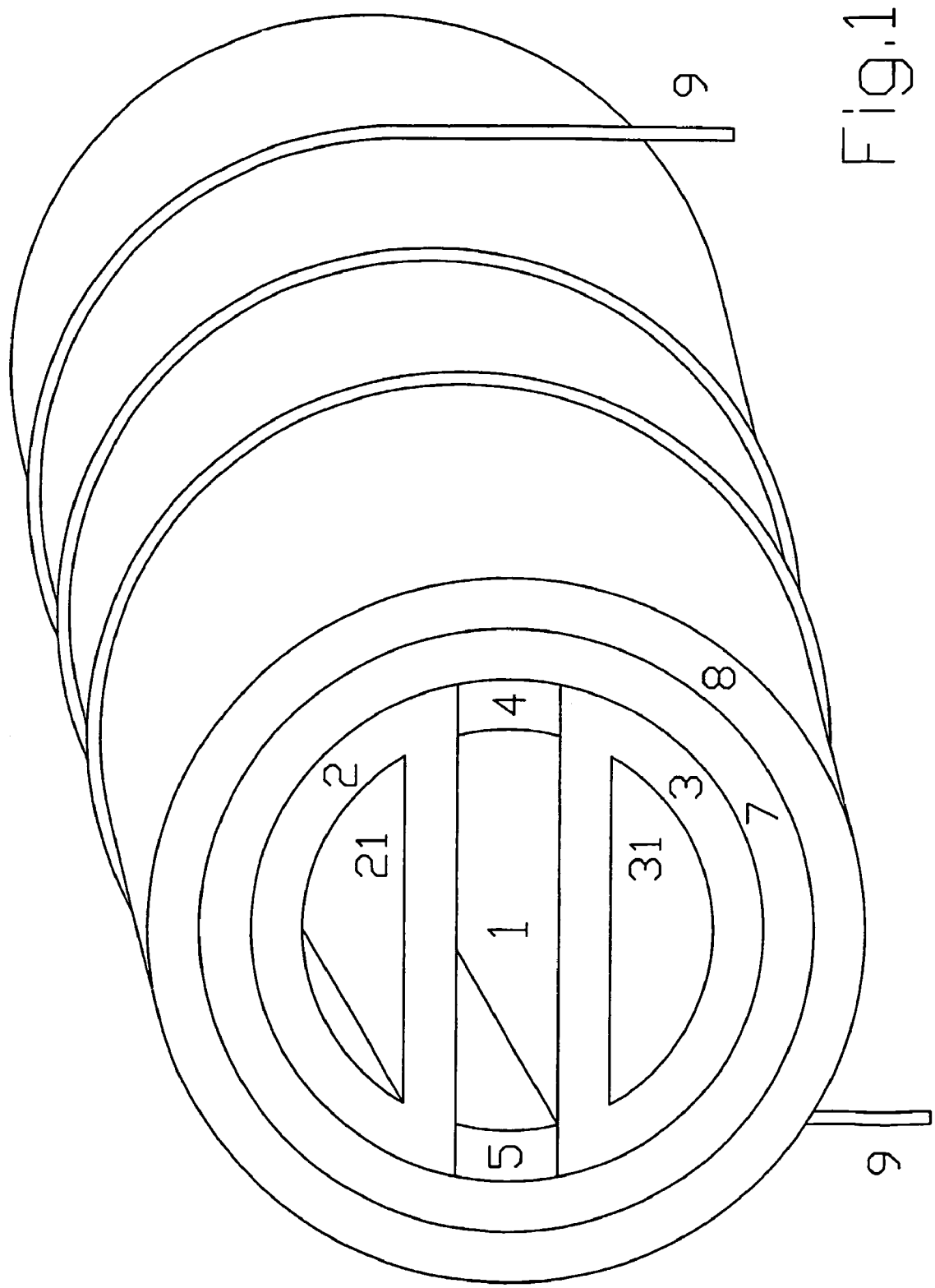

| | | | |
|---|---|---|---|
| 4,593,168 | A | 6/1986 | Amada |
| 4,667,076 | A | 5/1987 | Amada |
| 4,794,217 | A | 12/1988 | Quan et al. |
| 4,860,687 | A | 8/1989 | Frijlink |
| 5,106,204 | A | 4/1992 | Dunham |
| 5,155,062 | A | 10/1992 | Coleman |
| 5,221,356 | A | 6/1993 | Hillier et al. |
| 5,226,383 | A | 7/1993 | Bhat |
| 5,695,567 | A | 12/1997 | Kordina et al. |
| 5,788,777 | A | 8/1998 | Burk, Jr. |
| 5,792,257 | A | 8/1998 | Kordina et al. |
| 6,005,226 | A | 12/1999 | Aschner et al. |
| 6,797,069 | B2 | 9/2004 | Paisley et al. |
| 6,811,614 | B2 | 11/2004 | Kappeler et al. |
| 7,048,802 | B2 * | 5/2006 | Kaeppeler et al. ............ 118/725 |
| 2002/0090454 | A1 | 7/2002 | Paisley et al. |
| 2003/0188687 | A1 | 10/2003 | Paisley et al. |
| 2003/0233768 | A1 | 12/2003 | Kaeppeler |
| 2004/0020436 | A1 | 2/2004 | Kaeppeler et al. |
| 2004/0182310 | A1 * | 9/2004 | Kaeppeler .................. 117/200 |
| 2006/0054091 | A1 | 3/2006 | Speciale et al. |
| 2006/0081187 | A1 * | 4/2006 | Maccalli et al. ............. 118/725 |
| 2006/0118048 | A1 * | 6/2006 | Maccalli et al. ............. 118/728 |
| 2006/0275104 | A1 | 12/2006 | Speciale et al. |

FOREIGN PATENT DOCUMENTS

| | | |
|---|---|---|
| GB | 1 458 222 | 12/1976 |
| WO | WO02/38838 | 5/2002 |
| WO | WO02/38839 | 5/2002 |
| WO | WO03069029 A1 | 8/2003 |
| WO | WO2004053188 A1 | 6/2004 |

OTHER PUBLICATIONS

U.S. Appl. No. 10/538,547 Notice of Allowance dated Mar. 5, 2008, 17 pages.

U.S. Appl. No. 10/538,416 Response filed Jan. 31, 2008 to Initial Office Action dated Oct. 10, 2007, 9 pages.

"PCT International Search Report dated Jan. 21, 2004 for PCT/IT02/00363, from which U.S. Appl. No. 10/538,547 is based," 3 pgs.

"PCT Written Opinion dated Oct. 7, 2004 for PCT/IT02/00363, from which U.S. Appl. No. 10/538,547 is based," 6 pgs.

"PCT International Preliminary Examination Report dated Feb. 25, 2005 for PCT/IT02/00363, from which U.S. Appl. No. 10/538,547 is based," 10 pgs.

"PCT International Search Report dated Aug. 7, 2003 for PCT/IT02/00774, from which U.S. Appl. No. 10/538,529 is based and from which U.S. Appl. No. 10/538,547 claims priority," 4 pgs.

"PCT International Preliminary Examination Report dated Apr. 12, 2005 for PCT/IT02/00774, from which U.S. Appl. No. 10/538,529 is based and from which U.S. Appl. No. 10/538,547 claims priority," 5 pgs.

"PCT International Search Report dated Aug. 7, 2003 for PCT/IT02/00773, from which U.S. Appl. No. 10/538,416 is based," 4 pgs.

"PCT Written Opinion dated Jan. 18, 2005 for PCT/IT02/00773, from which U.S. Appl. No. 10/538,416 is based," 4 pgs.

"PCT International Preliminary Examination Report dated Apr. 12, 2005 for PCT/IT02/00773, from which U.S. Appl. No. 10/538,416 is based," 7 pgs.

"PCT International Search Report dated Mar. 8, 2005 for PCT/IT04/000335, from which U.S. Appl. No. 10/552,937 is based," 4 pgs.

"PCT Written Opinion dated Mar. 8, 2005 for PCT/IT04/000335, from which U.S. Appl. No. 10/552,937 is based," 5 pgs.

"PCT International Preliminary Examination Report mailed Dec. 14, 2006 for PCT/IT04/000335, from which U.S. Appl. No. 10/552,937 is based," 6 pgs.

"U.S. Appl. No. 10/538,416 Non Final Office Action mailed Apr. 18, 2008," 11 pgs.

U.S. Appl. No. 10/538,416 Response filed Jul. 18, 2008 to Non Final Office Action mailed Apr. 18, 2008, 10 pgs.

"U.S. Appl. No. 10/538,416 Notice of Allowance mailed Nov. 14, 2008," 3 pgs.

"U.S. Appl. No. 10/538,547 Non Final Office Action mailed May 2, 2006," 8 pgs.

"U.S. Appl. No. 10/538,547 Final Office Action mailed Jan. 19, 2007," 9 pgs.

"U.S. Appl. No. 10/538,547 Notice of Allowance mailed Aug. 9, 2007;" 6 pgs.

"U.S. Appl. No. 10/538,416 Non Final Office Action mailed Oct. 10, 2007," 9 pgs.

"U.S. Appl. No. 10/538,547 Response filed May 21, 2007 to Final Office Action mailed Jan. 19, 2007," 17 pgs.

"U.S. Appl. No. 10/538,547 Response filed Nov. 2, 2006 to Non Final Office Action mailed May 2, 2006," 8 pgs.

* cited by examiner

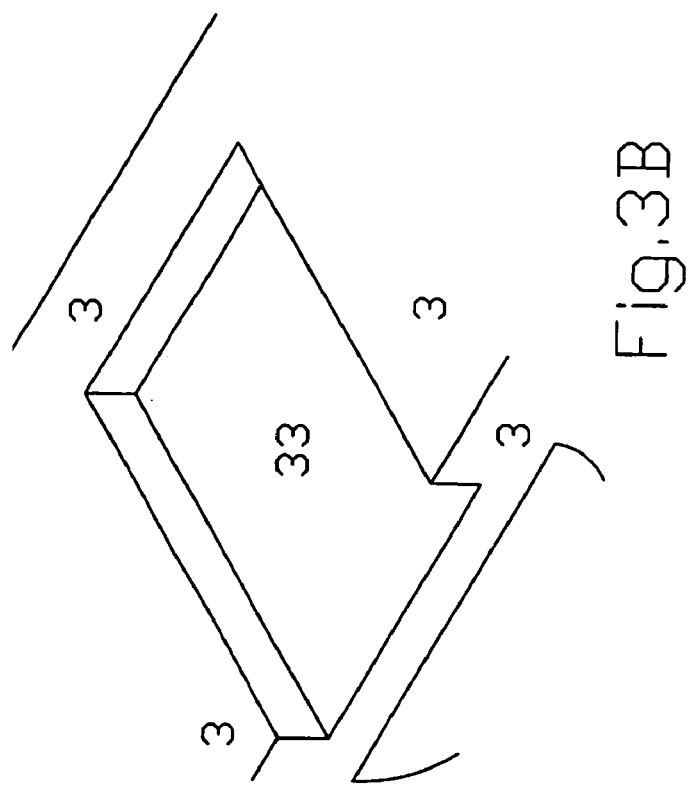
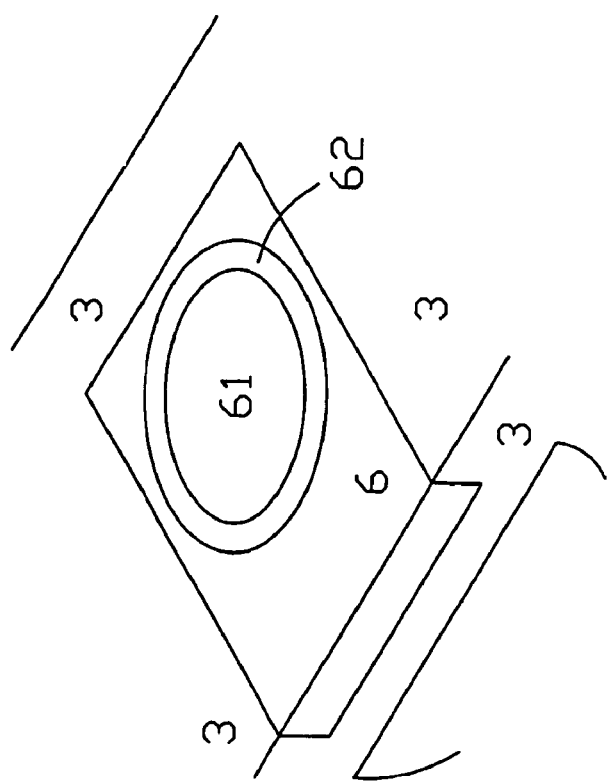

SUSCEPTOR SYSTEM

Cross-Reference to Related Applications

The present application claims priority to International Application No. PCT/1 T2002/000774, filed 10 Dec. 2002, the teachings of which are incorporated herein by reference in their entirety.

The present invention relates to a susceptor system for an apparatus of the type adapted to treat substrates and/or wafers.

In order to produce integrated circuits, it is necessary to treat substrates and/or wafers; these may be made of a single material (semiconducting or insulating) or of several materials (conducting, semiconducting and insulating); the term "substrate" and the term "wafer" often refer in practice to the same thing, that is, a thin element which is very often disc-shaped; the former term is usually used when the element serves basically solely for supporting layers or structures of semiconducting material; the second is usually used in all other cases.

There are purely thermal treatments and chemical/physical treatments which involve heating.

In general, in order to grow semiconducting materials (Si, Ge, SiGe, GaAs, AlN, GaN, SiC, . . . ) epitaxially on substrates, high temperatures are required if the quality of the material grown is to be suitable for microelectronic applications. For semiconducting materials such as silicon, temperatures typically of from 1000° C. to 1100° C. are used. For semiconducting materials such as silicon carbide, even higher temperatures are required; in particular, temperatures typically of from 1500° C. to 2000° C. are used.

A reactor for the epitaxial growth of silicon carbide or similar material therefore requires, amongst other things, a system which generates heat so that these temperatures can be achieved inside a reaction chamber, naturally it is desirable for the system to generate heat not only effectively but also efficiently. For these reasons reaction chambers with hot walls are used in reactors of these types.

One of the most suitable methods of heating the walls of a reaction chamber is the method based on electromagnetic induction; an element made of conducting material, an inductor, and an alternating electrical current (having a frequency typically of between 2 kHz and 20 kHz) are provided, the electrical current is caused to flow in the inductor so as to generate a variable magnetic field, the element is positioned in a manner such that it is immersed in the variable magnetic field; the electrical currents induced in the element because of the variable magnetic field cause heating of the element by the Joule effect; a heating element of this type is known as a susceptor and can be used directly as a wall of the reaction chamber, if suitable materials are used.

A reactor for the epitaxial growth of silicon carbide or similar material also requires the reaction chamber to be well insulated thermally from the outside environment particularly to limit heat losses, and to be well sealed to prevent, on the one hand, dispersal of reaction gases contaminating the outside environment and, on the other hand, entry of gases from the outside environment contaminating the reaction environment.

Some known susceptors suitable for use in reactors for the epitaxial growth of silicon carbide are described briefly below.

American patent U.S. Pat. No. 5,879,462 describes a cylindrical susceptor (of circular cross-section) which has an internal cavity (which acts as a reaction chamber), extending in a longitudinal direction and having a substantially rectangular cross-section; this susceptor is made entirely of silicon carbide in powder form; heating takes place by means which radiate a radiofrequency field.

American patent U.S. Pat. No. 5,674,320 describes a cylindrical susceptor (of substantially elliptical cross-section) which has two internal cavities (which act as reaction chambers) extending in a longitudinal direction and having identical and substantially rectangular cross-sections; this susceptor can be formed as a single piece or in two identical pieces each of which has an internal cavity; the pieces of the susceptor are made of graphite and are coated with a layer of silicon carbide; in the two-piece susceptor, the pieces are joined together mechanically by means of graphite screws and are electrically insulated from one another, in particular by the layer of silicon carbide; heating takes place by electromagnetic induction: the electrical currents induced in the graphite flow all around each cavity.

American patent U.S. Pat. No. 5,792,257 describes a cylindrical susceptor (of substantially elliptical cross-section) which has an internal cavity (which acts as a reaction chamber), extending in a longitudinal direction and having a substantially rectangular cross-section; the susceptor is made of graphite and is coated with a layer of silicon carbide; heating takes place by electromagnetic induction; the electrical currents induced in the graphite flow all around the cavity; in order to protect the region of the cavity on which the substrate to be grown is supported, a small silicon carbide plate is provided, fitted on the lower wall of the cavity, and the substrate is placed thereon.

American patent U.S. Pat. No. 5,695,567 describes a prismatic susceptor (of hexagonal cross-section) which has an internal cavity (which acts as a reaction chamber), extending in a longitudinal direction and having a rectangular cross-section; this susceptor is made in four pieces; the pieces of the susceptor are made of graphite and are coated with a layer of silicon carbide; the pieces are joined to one another mechanically by means of graphite screws; two silicon carbide plates cover the upper and lower pieces of the susceptor so as to separate the side pieces from the upper and lower pieces; heating takes place by electromagnetic induction; the electrical currents induced in the graphite flow within each piece which delimits the cavity.

The object of the present invention is to provide a susceptor system for an apparatus of the type adapted to treat substrates and/or wafers, which is adapted to be heated by electromagnetic induction, which heats the treatment chamber uniformly, effectively and efficiently, which does not have electrical sparks problems, and which is also of simple construction.

This object is achieved by the susceptor system having the characteristics set out in independent claim 1.

The concept upon which the present invention is based is that of providing a treatment chamber in the form of a cavity delimited by four walls, but of using only two of the four walls for actively heating the chamber and using the other two walls to heat the chamber passively and to keep the first two walls electrically insulated.

Advantageous characteristics of the susceptor system according to the present invention are set out in the claims that are directly or indirectly dependent on claim 1.

According to a further aspect, the present invention also relates to an apparatus for treating substrates and/or wafers, having the characteristics set out in independent claim 15.

Advantageous characteristics of the apparatus according to the present invention are set out in the claims that are directly or indirectly dependent on claim 15.

Figure 2:
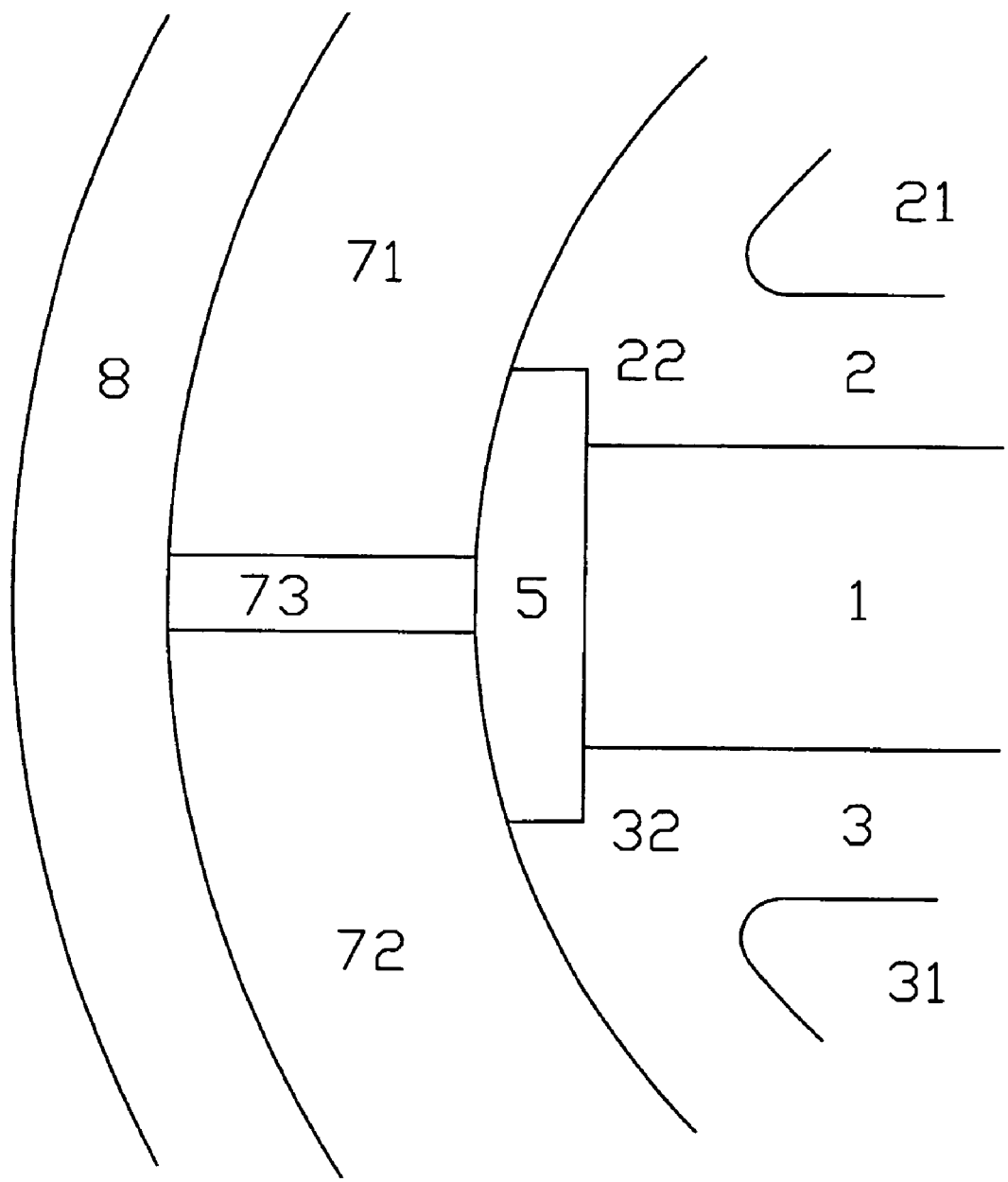
Figure 4:
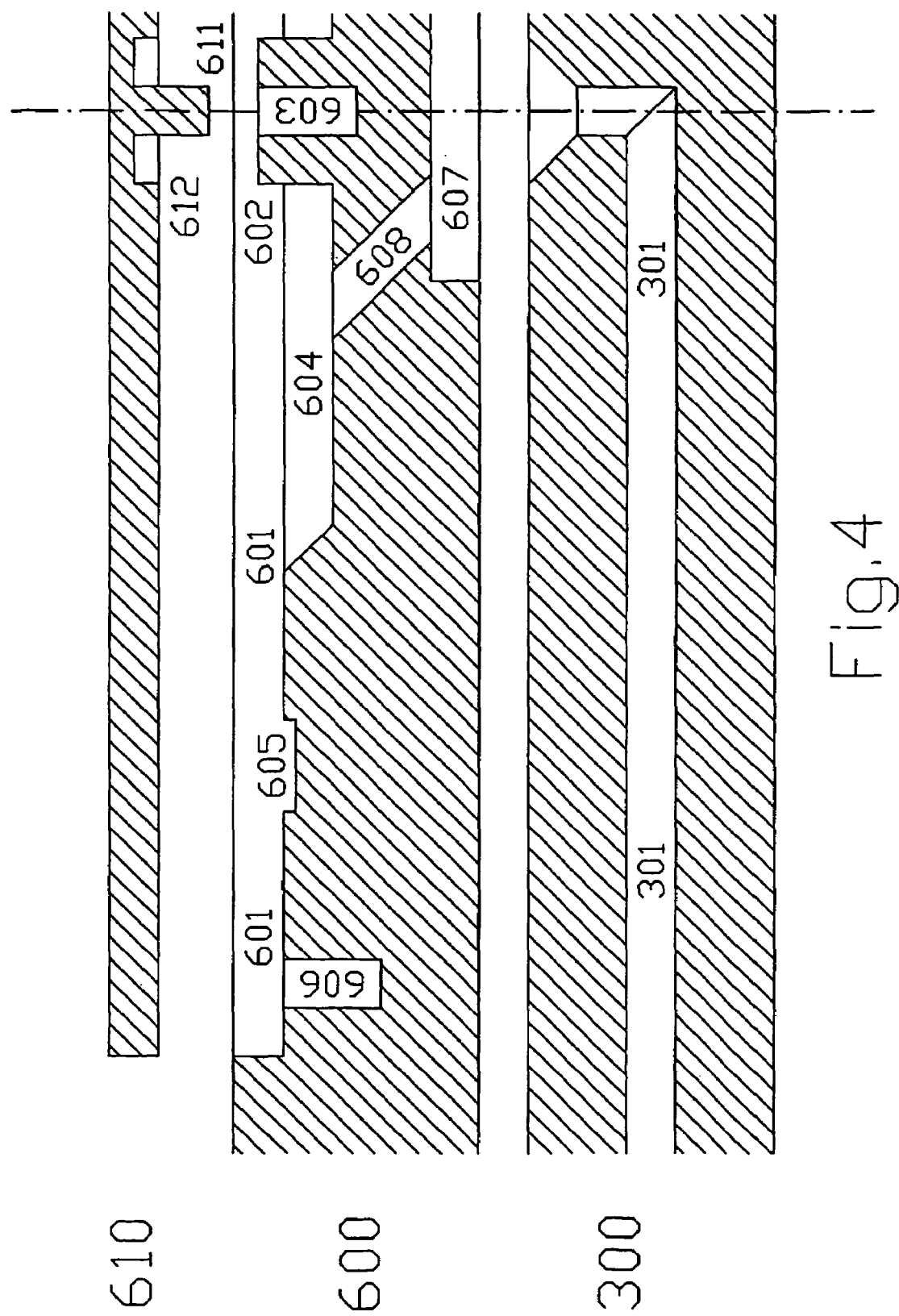
Figure 5:
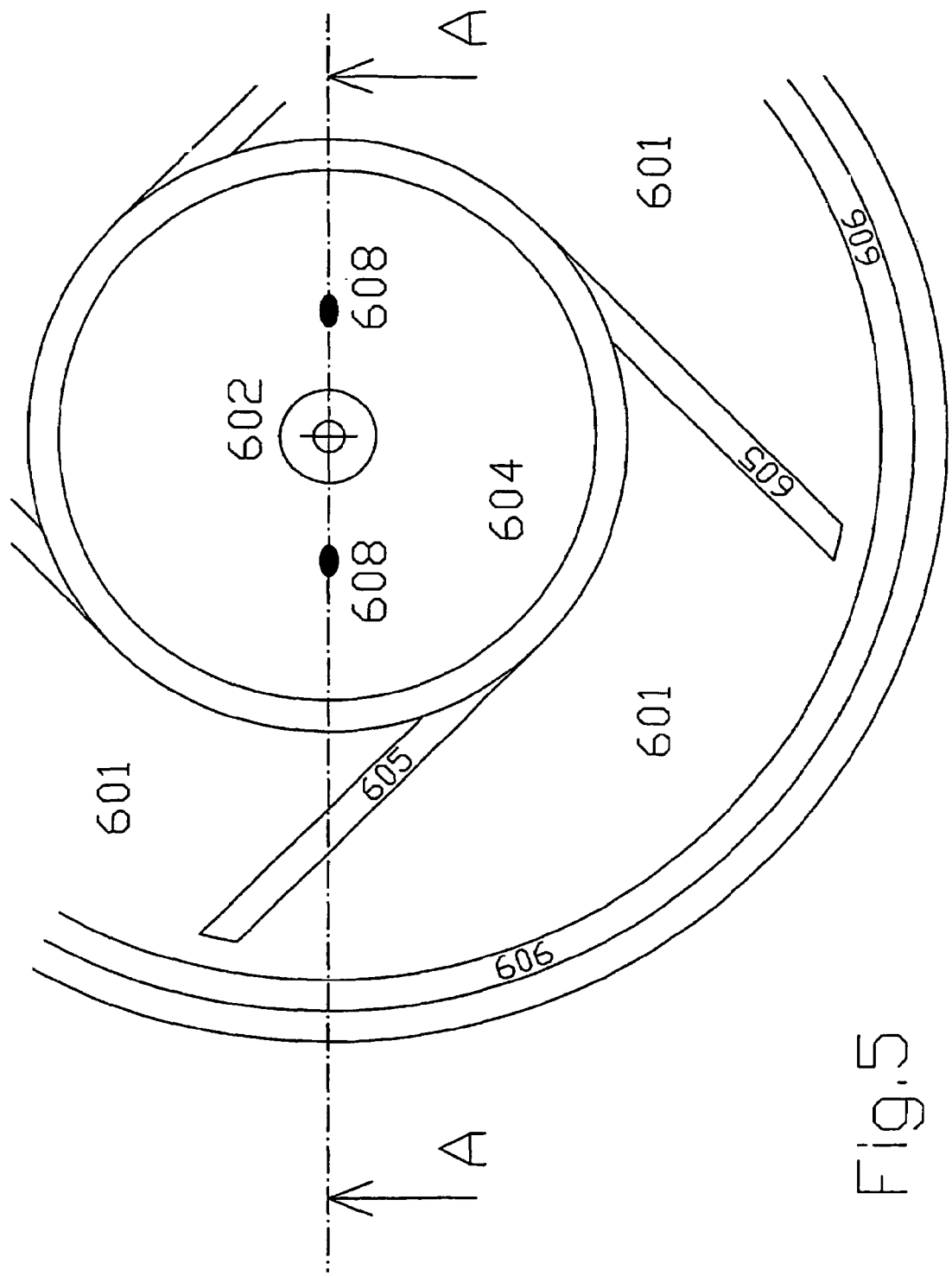

The present invention will become clearer from the following description which is to be considered jointly with the appended drawings, in which:

FIG. 1 is a schematic, axonometric view of a susceptor system according to the present invention, with some additional elements, FIG. 2 is a schematic view showing, in section, a detail of a susceptor system according to the present invention with some additional elements, FIGS. 3a and 3b are schematic, axonometric views of the lower wall of a susceptor system according to the present invention provided with a slide, with the slide fully inserted and with the slide removed, respectively, FIG. 4 is a detailed view, partially in section, of the lower wall of a susceptor system according to the present invention with a slide and a rotatable disc, and FIG. 5 is a partial detailed top view, of the slide of the wall of FIG. 4, without the disc.

The present invention will be described below with reference to the embodiments shown in FIGS. 1, 2 and 3, but is not limited to these embodiments.

The susceptor system according to the present invention is designed specifically for an apparatus of the type adapted to treat substrates and/or wafers; it is provided with a cavity, indicated 1 in the drawings, which acts as a chamber for the treatment of the substrates and/or wafers and which extends in a longitudinal direction.

The cavity is delimited by an upper wall, indicated 2 in the drawings, by a lower wall, indicated 3 in the drawings, by a right-hand side wall, indicated 4 in the drawings, and by a left-hand side wall, indicated 5 in the drawings.

The upper wall 2 is constituted by at least one piece of electrically conducting material which is suitable for being heated by electromagnetic induction; the lower wall 3 is constituted by at least one piece of electrically conducting material which is suitable for being heated by electromagnetic induction; the right-hand side wall 4 is constituted by at least one piece of inert, refractory and electrically insulating material; the left-hand side wall 5 is constituted by at least one piece of inert, refractory and electrically insulating material. The upper wall 2 is therefore electrically insulated from the lower wall 3.

In the embodiment of FIG. 1, the susceptor system is constituted purely and simply by the four pieces constituted by the four walls 2, 3, 4, 5. In the embodiment shown partially in FIG. 2, a further two elements are included in the susceptor system, but the pieces comprising the four walls nevertheless constitute its core.

The treatment chamber in the form of a cavity is thus delimited by the four walls of the susceptor system; two of these walls (the upper wall 2 and the lower wall 3) heat the chamber actively, whereas the other two (the side walls 4 and 5) heat the chamber passively; moreover, electrical sparks could occur solely directly between the upper wall 2 and the lower wall 3 and this is improbable because of the distance; finally, the currents induced in the upper wall 2 and in the lower wall 3 are independent of one another.

In the embodiments shown in the drawings, each of the walls 2, 3, 4, 5 is constituted by a single piece; this is advantageous from the constructional point of view.

A substance which is particularly suitable for producing the pieces made of conducting material for the wall 2 and the wall 3 is graphite; however, graphite cannot withstand the typical environment of a treatment chamber and therefore has to be coated with a layer of material that is more resistant from the chemical and thermal points of view.

A compound suitable for producing the coating layer is silicon carbide; however, if the chamber is also used for the epitaxial growth of silicon carbide, it is preferable to use even more resistant compounds such as niobium carbide, boron carbide, or tantalum carbide; amongst other things, the latter two also have the advantage of being electrical conductors.

Other compounds usable to produce the coating layer are some nitrides; amongst these, silicon nitride, aluminium nitride and, in particular, boron nitride may be mentioned. Nitrides are to be used with great care if, for example, silicon carbide is to be treated in the chamber, in fact, if nitrogen atoms should become detached from the coating layer, they would dope the silicon carbide.

Naturally, the coating of the graphite is strictly necessary only in the areas of the pieces that are adjacent to the cavity 1, but it may sometimes be more convenient to produce complete coatings, or at least beyond the necessary minimum.

It should be explained that the above-mentioned chemical substances have physical properties which depend on their allotropic form and also on the production process; for example, carbon, silicon carbide, and boron nitride have more than one stable allotropic form, with quite different physical properties; again, for example, with graphite it is possible to produce materials with good thermal and electrical conductivity and materials with poor thermal and electrical conductivity; finally, the addition of chemical compounds to a material can modify some of its physical properties.

The coating layer may be produced basically in two ways: by chemical reaction, or by physical application. For example, a layer made of a carbide can generally be produced more easily by chemical reaction on a graphite piece. There are companies that are specialized in producing such layers.

As far as the thickness of the coating layer is concerned, for silicon carbide, it may be, for example, 100 m and for tantalum carbide, for example 20 m; the thickness to be used may depend, amongst other things, on the properties of the material and on the function required.

A compound which is particularly suitable for the production of pieces made of inert, refractory and electrically insulating material for the side walls 4 and 5 is silicon carbide; in this case, moreover, the pieces conduct heat well and thus achieve good passive heating.

Another compound which is particularly suitable for producing the pieces made of inert, refractory and electrically insulating material for the side walls 4 and 5 is boron nitride; in this case also, the pieces conduct heat well and thus achieve good passive heating; in fact this compound has a hexagonal allotropic form with physical properties similar to those of graphite and a cubic allotropic form with physical properties similar to those of diamond; one or other allotropic form can be produced, according to the production process.

The external shape of the cross-section of the susceptor system according to the present invention is advantageously substantially uniform in the longitudinal direction and substantially circular or substantially elliptical; the susceptor system is in fact thus easy to produce and can easily be coupled well with an inductor for heating it.

The shape of the cross-section of the cavity, that is, of the treatment chamber, is also advantageously substantially uniform in the longitudinal direction; the susceptor system is in fact thus easy to produce.

In known reactors, the cross-section of the chamber reduces in the longitudinal direction to compensate for the reduced concentration of the precursors. Instead, the present invention solves this problem by causing the substrates or wafers to rotate and using a high flow of reaction gas; this high gas-flow also has the advantage of effectively and quickly removing any solid particles from the reaction chamber.

The average width of the cavity 1, that is, of the treatment chamber, is preferably at least three times, even more preferably at least five times, the average height of the cavity 1; the heating of the treatment chamber is in fact thus due to a greater extent to the walls 2 and 3, that is, to the walls which heat the chamber actively.

The pieces for the side walls may simply have a cross-section having a substantially rectangular or trapezoidal shape; this is the case in the embodiments of FIG. 1 and of FIG. 2.

According to a particularly effective solution, the piece for the upper wall 2 and/or the piece for the lower wall 3 have cross-sections having the external shape substantially of a segment of a circle or of a segment of an ellipse; this is the case in the embodiments of FIG. 1 and FIG. 2; the area traversed by the magnetic field of the inductor is in fact thus large and the currents induced are therefore large.

The pieces for the four walls 2, 3, 4, 5 may simply be placed close together and inserted in a suitable compartment; this is the case in the embodiment of FIG. 1. Advantageously, the piece for the upper wall 2 and/or the piece for the lower wall 3 have grooves and/or ribs in the longitudinal direction for joining with the pieces for the side walls 4, 5; the structure of the susceptor system is thus firmer, even though its component parts are no more difficult to produce; this is the case in the embodiment of FIG. 2, in which the wall 2 has two lateral grooves 22 (of which only one is shown in the drawing) and the wall 3 has two lateral grooves 32 (of which only one is shown in the drawing).

In all of the embodiments shown in the drawings, the piece for the upper wall and/or the piece for the lower wall are hollow; the mass of the susceptor system is thus very low and it can therefore be heated (and also cooled) very quickly.

If the piece is hollow so as to have a large through-hole which extends in the longitudinal direction, the currents induced in the wall are necessarily confined to its peripheral region and thus flow very close to the treatment chamber, in which they generate heat. The number of through-holes for each wall may in fact be greater than one, but the effect does not change substantially.

In the embodiments of FIG. 1 and of FIG. 2, each of the upper wall 2 and the lower wall 3 has a single through-hole, indicated 21 or 31, respectively.

The embodiment shown partially in FIG. 3 has various advantageous characteristics which will be described below.

The susceptor system according to the present invention may advantageously comprise a slide, indicated 6 in FIG. 3, mounted within the cavity 1, that is, in the treatment chamber, and suitable for supporting at least one substrate or at least one wafer; the slide 6 can slide in guided manner in the longitudinal direction; operations to insert and remove substrates or wafers are thus facilitated; in fact the substrates or wafers are manipulated outside the treatment chamber and are inserted and removed by the movement of the slide.

In practice, it is convenient to arrange for the lower wall, indicated 3 in FIG. 3, to have a guide, indicated 33 in FIG. 3, which is suitable for receiving the slide, indicated 6 in FIG. 3, and which extends in the longitudinal direction in a manner such that the slide can slide along the guide. In the embodiment of FIG. 3, the guide is formed entirely within the wall 3 and the slide 6 has a flat upper surface that is substantially aligned with the flat upper surface of the wall; the effective cross-section of the treatment chamber is thus substantially rectangular and regular (as if the slide were not provided).

To achieve a more uniform treatment of the substrates or wafers, the slide may comprise at least one disc suitable for supporting at least one substrate or at least one wafer and may be provided with a recess for housing the disc rotatably, in the embodiment of FIG. 3, the slide 6 is provided with a recess 62 and comprises a single disc 61.

With regard to the materials of the disc and of the slide, the embodiment of FIG. 3 is made in the manner described below.

The slide 6 is made of graphite coated with a layer of tantalum carbide; the slide 6 thus also acts as a susceptor since it is immersed in the magnetic field and it is an electrical conductor, moreover, the currents induced in the wall 3 can also flow in the slide 6 since the tantalum carbide layer is an electrical conductor and does not therefore insulate the slide 6 electrically from the wall 3.

The disc 61 is made of graphite coated with a layer of tantalum carbide; the disc 61 thus also acts as a susceptor since it is immersed in the magnetic field and is an electrical conductor; the currents induced in the wall 3 and in the slide 6 cannot, however, flow in the disc 61 because, when the disc 61 rotates, it is kept slightly raised from the slide (whilst remaining substantially within its recess 62), by a gas-flow.

In apparatus for the treatment of substrates and/or wafers and, in particular, in epitaxial reactors, it is quite common to rotate the support for the substrates; this rotation is generally performed by means of a motor which is disposed outside the treatment chamber and which imparts a rotary motion to the support via suitable transmission means.

This method of rotation functions well but has the disadvantage of requiring either transmission means which can withstand the environment of the treatment chamber, or sealing means which enable a rotary motion to be transmitted, or both; these requirements are even more difficult to satisfy in reactors for the growth of materials such as silicon carbide because of the very high temperatures; moreover, in a susceptor with a slide such as that shown in FIG. 3, the drive-transmission means would have to be opened when the slide were removed and closed when the slide were inserted, which is very complex to achieve.

To solve this problem, it has been planned to use a different method of rotation based on the use of a gas-flow.

The solution adopted is described below with the aid of FIG. 4 and FIG. 5, with non-limiting reference to an epitaxial reactor.

A support 610 is provided for a predetermined number (for example one, three, four, five, . . . ) of substrates; the support 610 has substantially the shape of a thin disc and has, on its upper side, recesses (not shown in the drawings) for housing the substrates and, on its lower side, a central cylindrical pin 611 which projects from a small cylindrical recess 612; the pin 611 serves to hold the support 610 in position and to guide its rotation; moreover, the two faces of the support 610 are flat.

A slide 600 is also provided for housing the support 610; the slide 600 has substantially the shape of a thick rectangular plate; on its upper side, the slide 600 has a large cylindrical recess 601 for the complete insertion of the support 610, from which recess a small central cylinder 602 projects, with a blind hole 603 for the complete insertion of the pin 611 of the support 610; in the base of the large recess 601 there is a first shallow, centred, cylindrical recess 604 with a diameter which is much smaller, for example, by half; in the base of the large recess 601, there is a predetermined number of very shallow, straight channels 605 (in FIG. 5 there are four channels, but there could also be three or five, six, seven, eight, . . . channels) which start from the first shallow recess 604 and extend tangentially therefrom; also in the base of the large recess 601, in the vicinity of its perimeter, there is a deep circular groove 606; an outlet duct (not shown in the figures) is also formed inside the slide 600, starting from the groove 606; on its lower side, the slide 600 has a second shallow cylindrical recess 607, which is centred relative to the first shallow recess 604 and is in communication therewith by means of a predetermined number (in FIG. 5, there are two, but there could also be one or three, four, . . . ) of short, oblique, cylindrical ducts 608 (which, alternatively, could be vertical).

Finally, one wall 300 of the susceptor system has a guide (not shown in the drawings) for housing the slide 600; the slide 600 can slide along the guide but remains stationary during epitaxial growth processes; the wall 300 also has a long duct 301 which opens in the base of the guide in a vertical direction, in the region of the second shallow recess 607 of the slide 600 (in FIG. 4, the duct 301 opens in a centred position but it could also open in an eccentric position relative to the axis of symmetry of the support 610).

The method adopted is summarized in the following paragraph.

A flow of gas is caused to enter the wall duct 301 that opens in the base of the slide guide; the gas-flow enters the recess 607 of the slide, passes to the recess 604 of the slide through the ducts 608 of the slide and creates, in the recess 604 of the slide, a pressure which lifts the support 610 slightly, the gas under pressure in the recess 604 of the slide is urged into the channels 605 of the slide and collects in the groove 606 of the slide; the flow of the gas along the channels 605 of the slide brings about rotation of the slightly raised support 610, by friction.

A susceptor system of this type is typically usable in an apparatus of the type adapted to treat substrates and/or wafers; this is a further aspect of the present invention.

The apparatus according to the present invention will be described below with non-limiting reference to FIG. 1 and FIG. 2.

The apparatus according to the present invention comprises, essentially, a susceptor system provided with a cavity which acts as a treatment chamber, extends in a longitudinal direction, and is delimited by a conducting upper wall, by a conducting lower wall, by an insulating right-hand side wall and by an insulating left-hand side wall.

The apparatus according to the present invention may also advantageously comprise a first refractory and thermally insulating structure 7 that is suitable for surrounding the susceptor system (formed in FIG. 1 by the four walls 2, 3, 4, 5) and is constituted, essentially, by a tube of high-porosity graphite or of similar refractory and thermally insulating material, which extends in the longitudinal direction.

Known refractory and thermally insulating structures for these apparatuses are formed as single pieces.

At the experimental stage of the present invention, it was planned to produce a structure of this type by means of two or more pieces of high-porosity graphite, which would be very convenient from the constructional point of view, and to place graphite having a soft felt-type structure between the pieces so as to achieve a good joint between the various pieces and to maintain the thermal insulation.

If one of these known structures is made of a material which is at least slightly conducting (such as high-porosity graphite) and if it is used in an apparatus heated by electromagnetic induction, electrical currents may be established within the structure; these currents may be due in part to the electromagnetic induction within the structure and in part to contact with the susceptor; if some of the current induced in the susceptor is dispersed elsewhere, the efficacy and the efficiency of the susceptor is therefore reduced.

To solve this problem, it was planned to made a structure of this type by means of two or pieces of high-porosity graphite or of similar conducting material, which would be very convenient from the constructional point of view, and to place elements of refractory, thermally insulating and electrically insulating material between the pieces; for example, silicon carbide, or boron nitride, preferably porous, may be used for this material.

In the embodiment of FIG. 2, the graphite tube is divided, in the longitudinal direction, into two half-tubes 71 and 72; the structure 7 comprises, in addition to the two half-tubes 71 and 72, two elements 73 (of which only one is shown in the drawing) of refractory, thermally insulating and electrically insulating material, which extend in the longitudinal direction and which are disposed between the two half-tubes 71 and 72.

The apparatus according to the present invention may also advantageously comprise a second, hermetic structure 8 suitable for surrounding the first structure 7; this facilitates the choice of materials.

The hermetic structure may be constituted substantially by a tube of quartz or similar material which surrounds the refractory structure, extends in the longitudinal direction, and has a substantially uniform and substantially circular or substantially elliptical external cross-sectional shape; this is the case in the embodiment of FIG. 1.

Alternatively, the hermetic structure may be constituted substantially by a tube of quartz or similar material which surrounds the refractory structure and which extends in the longitudinal direction, and by a metal tube which surrounds the quartz tube; in this case, the external shape of the cross-section of the quartz tube is not very important since mechanical stresses are withstood by the metal tube.

The apparatus according to the present invention may also advantageously comprise electrical conduction means 9 which are suitable for heating the susceptor system by electromagnetic induction and which are wound around the first structure 7 or the second structure 8; this is the case in the embodiment of FIG. 1.

If the susceptor system of the apparatus has walls provided with through-holes, as in the embodiments shown in the drawings, the apparatus may advantageously comprise means suitable for causing at least one gas-flow to flow within at least one of the holes; the gas-flow may serve to remove any particles which are detached from the internal walls of the hole; the gas-flow may also serve to modify the temperature of the susceptor system slightly, argon or, more generally, an inert gas, is suitable in particular for the former function; hydrogen, for example, is suitable in particular for the latter function and, more particularly, for cooling.

The apparatus according to the present invention can be used, with the addition of further components, as a reactor for the epitaxial growth of silicon carbide or similar material on substrates.

Silicon carbide is a semiconducting material which is very promising but also very difficult to handle; most of the characteristics set out above are designed particularly for this use and for this material.

The apparatus according to the present invention may also be used, with the addition of further components, as apparatus for the high-temperature thermal treatment of wafers.

The invention claimed is:

1. A susceptor system for an apparatus of the type adapted to treat substrates and/or wafers, the susceptor system being provided with a cavity (1) which acts as a chamber for the treatment of the substrates and/or wafers and which extends in a longitudinal direction and is delimited by an upper wall (2), by a lower wall (3), by a right-hand side wall (4), and by a left-hand side wall (5), the upper wall (2) being constituted by at least one piece of electrically conducting material suitable for being heated by electromagnetic induction, the lower wall (3) being constituted by at least one piece of electrically conducting material suitable for being heated by electromagnetic induction, the right-hand side wall (4) being made in its entirety by at least one piece of inert, refractory material and preventing conduction of electrical current there through, the left-hand side wall (5) being made in its entirety by at least one piece of inert, refractory material and preventing conduction of electrical current there through, the right-hand side wall (4) and the left-hand side wall (5) each separating the upper wall (2) from the lower wall (3) SO that the or each piece of the upper wall (2) is electrically insulated from the or each piece of the lower wall (3), the walls (2, 3, 4, 5) being included in the susceptor system.

2. A susceptor system according to claim 1 in which each of the right-hand wall (4) and the left-hand wall (5) is constituted by a single piece.

3. A susceptor system according to claim 1 in which the or each piece of the upper wall (2) and of the lower wall (3) is made of graphite or similar electrically conducting material and is coated with a layer of silicon, tantalum, niobium, or boron carbide, or of silicon, boron, or aluminum nitride, or of similar inert and refractory material, at least in the areas adjacent the cavity (1).

4. A susceptor system according to claim 1 in which the external shape of the cross-section of the susceptor system is substantially uniform in the longitudinal direction and is substantially circular or elliptical.

5. A susceptor system according to claim 1 in which the shape of the cross-section of the cavity (1) is substantially uniform in the longitudinal direction.

6. A susceptor system according to claim 1 in which the average width of the cavity (1) is at least three times, more preferably at least five times, the average height of the cavity (1).

7. A susceptor system according to claim 1 in which the pieces of the side walls (4, 5) have cross-sections of substantially rectangular or trapezoidal shape.

8. A susceptor system according to claim 1 in which the piece of the upper wall (2) and/or the piece of the lower wall (3) have cross-sections having the external shape substantially of a segment of a circle or a segment of an ellipse.

9. A susceptor system according to claim 1 in which the piece of the upper wall (2) and/or the piece of the lower wall (3) have grooves (22, 32) and/or ribs in the longitudinal direction for joining with the pieces of the side walls (4, 5).

10. A susceptor system according to claim 1 in which the piece of the upper wall (2) and/or the piece of the lower wall (3) is hollow so as to have at least one hole (21, 31), preferably a through-hole, which extends in the longitudinal direction.

11. A susceptor system according to claim 1 comprising a slide (6) mounted inside the cavity (1) and suitable for supporting at least one substrate or at least one wafer, the slide (6) being slidable in guided manner in the longitudinal direction.

12. A susceptor system according to claim 11 in which the lower wall (3) has a guide (33) which is suitable for receiving the slide (6) and which extends in the longitudinal direction so that the slide (6) can slide along the guide (33).

13. A susceptor system according to claim 11 in which the slide (6) comprises at least one disc (61) suitable for supporting at least one substrate or at least one wafer, and is provided with a recess (62) suitable for housing the disc (61) rotatably.

14. Apparatus of the type adapted to treat substrates and/or wafers, characterized in that it comprises at least one susceptor system (2, 3, 4, 5) according to claim 1.

15. Apparatus according to claim 14, comprising a first refractory and thermally insulating structure (7) which surrounds the susceptor system (2, 3, 4, 5) and is constituted substantially by a tube of high-porosity graphite or similar material and which extends in the longitudinal direction.

16. Apparatus according to claim 15 in which the first structure (7) is divided, in the longitudinal direction, into two half-tubes (71, 72) and the first structure (7) further comprises two elements (73) of refractory, thermally insulating and preferably electrically insulating material which extend in the longitudinal direction and are disposed between the two half-tubes (71, 72).

17. Apparatus according to claim 15 comprising a second, hermetic structure (8) suitable for surrounding the first structure (7).

18. Apparatus according to claim 14 comprising electrical conduction means (9) which are suitable for heating the susceptor system by electromagnetic induction and which are wound around the first structure (7) or around the second structure (8).

19. Apparatus according to any one of claims 14 to 18, comprising means for causing at lcast one gas-flow to flow in at least one through-hole (21, 31) of the susceptor system.

20. Apparatus according to claim 14 characterized in that it is a reactor for the epitaxial growth of silicon carbide or similar material on substrates.

21. Apparatus according to claim 14 characterized in that it is an apparatus for the high-temperature thermal treatment of wafers.

22. A susceptor system for an apparatus of the type adapted to treat substrates and/or wafers, the susceptor system being provided with a cavity (1) which acts as a chamber for the treatment of the substrates and/or wafers and which extends in a longitudinal direction and is delimited by an upper wall (2), by a lower wall (3), by a right-hand side wall (4), and by a left-hand side wall (5), the upper wall (2) being constituted by at least one piece of electrically conducting material suitable for being heated by electromagnetic induction, the lower wall (3) being constituted by at least one piece of electrically conducting material suitable for being heated by electromagnetic induction, the right-hand side wall (4) being made in its entirety by at least one piece of inert, refractory material and preventing conduction of electrical current there through, the left-hand side wall (5) being made in its entirety by at least one piece of inert, refractory material and preventing conduction of electrical current there through, the right-hand side wall (4) and left- hand side wall (5) each separating the upper wall (2) from the lower wall (3) so that the or each piece of the upper wall (2) is electrically insulated from the or each piece of the lower wall (3), the walls (2, 3, 4, 5) being included in the susceptor system, the susceptor system further comprising a first refractory and thermally insulating structure (7) which surrounds the susceptor system (2, 3, 4, 5) and which extends in the longitudinal direction.

23. A susceptor system according to claim 1 in which the or each piece of the side walls (4, 5) is made of one or more of silicon carbide and boron nitride.

24. A susceptor system according to claim 22 in which the or each piece of the side walls (4, 5) is made of one or more of silicon carbide and boron nitride.

25. A susceptor system according to claim 1 in which each of the walls (2, 3, 4, 5) is constituted by a single piece.

26. A susceptor system according to claim 22 in which each of the right-hand wall (4) and the left-hand wall (5) is constituted by a single piece.

27. A susceptor system according to claim 22 in which each of the walls (2, 3, 4, 5) is constituted by a single piece.

* * * * *

UNITED STATES PATENT AND TRADEMARK OFFICE
CERTIFICATE OF CORRECTION

PATENT NO. : 7,615,121 B2 Page 1 of 1
APPLICATION NO. : 10/538529
DATED : November 10, 2009
INVENTOR(S) : Maccalli et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 216 days.

Signed and Sealed this

Nineteenth Day of October, 2010

David J. Kappos
*Director of the United States Patent and Trademark Office*